(12) United States Patent
Milo et al.

(10) Patent No.: US 10,439,313 B2
(45) Date of Patent: Oct. 8, 2019

(54) INTEGRATED CIRCUIT (IC) CHIP SOCKET

(71) Applicant: TEXAS INSTRUMENTS INCORPORATED, Dallas, TX (US)

(72) Inventors: Dolores Babaran Milo, Baguio (PH); Michael Flores Milo, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 155 days.

(21) Appl. No.: 15/369,449

(22) Filed: Dec. 5, 2016

(65) Prior Publication Data
US 2018/0159259 A1    Jun. 7, 2018

(51) Int. Cl.
*G01R 31/28*      (2006.01)
*H01R 13/24*     (2006.01)
*H01L 23/498*    (2006.01)
*G01R 1/04*       (2006.01)
*G06F 17/50*     (2006.01)

(52) U.S. Cl.
CPC ....... *H01R 13/2421* (2013.01); *G01R 1/0466* (2013.01); *G06F 17/5072* (2013.01); *H01L 23/4985* (2013.01); *H01L 23/49811* (2013.01)

(58) Field of Classification Search
CPC .............. G01R 1/0466; G01R 1/07314; G01R 31/2879; G01R 31/2886; G01R 31/2889; G01R 31/2896
See application file for complete search history.

(56) References Cited

U.S. PATENT DOCUMENTS

| 7,112,889 B1* | 9/2006 | Maruyama | H01L 22/12 257/797 |
| 2011/0298487 A1* | 12/2011 | Katsuma | G01R 31/2889 324/756.07 |

* cited by examiner

*Primary Examiner* — Tung X Nguyen
(74) *Attorney, Agent, or Firm* — Ronald O. Neerings; Charles A. Brill; Frank D. Cimino

(57) ABSTRACT

An integrated circuit (IC) chip socket that can include a non-conductive housing and moveable pogo pins positioned within the non-conductive housing. The moveable pogo pins can include active pogo pins, each active pogo pin being positioned to a corresponding lead of an IC chip insertable into the IC chip socket. Moveable pogo pins can also include an inactive pogo pin positioned to avoid contacting each lead of the IC chip insertable into the IC chip socket.

22 Claims, 6 Drawing Sheets

US 10,439,313 B2

INTEGRATED CIRCUIT (IC) CHIP SOCKET

TECHNICAL FIELD

This disclosure relates to an integrated circuit (IC) chip socket. More particularly, this disclosure relates to an IC chip socket that includes moveable pogo pins.

BACKGROUND

A pogo pin is a device used in electronics to establish a (usually temporary) connection between two printed circuit boards. Named by analogy with the pogo stick toy, the pogo pin usually takes the form of a slender cylinder containing a sharp, spring-loaded pin. A pogo pin is designed such that upon being pressed by an electronic circuit, the sharp point at the end of the pogo pin makes secure contact with the electric circuit.

Flat no-leads packages such as quad-flat no-leads (QFN), dual-flat no-leads (DFN) physically and electrically connect integrated circuit (IC) chips to substrates such as printed circuit boards (PCBs). Flat no-leads packages, also known as micro leadframe (MLF) and small-outline no leads (SON), is a surface-mount technology, one of several package technologies that connect IC chips to the surfaces of PCBs without through-holes. Flat no-lead is a near chip scale package plastic encapsulated package made with a planar copper leadframe substrate. Perimeter leads on the package bottom can provide electrical connections to the PCB. Flat no-lead packages include an exposed thermal pad to improve heat transfer out of the IC chip (into the PCB). Heat transfer can be further facilitated by metal vias in the thermal pad.

SUMMARY

One example relates to an integrated circuit (IC) chip socket that can include a non-conductive housing and moveable pogo pins positioned within the non-conductive housing. The moveable pogo pins can include active pogo pins, each active pogo pin being positioned to a corresponding lead of an IC chip insertable into the IC chip socket. Moveable pogo pins can also include an inactive pogo pin positioned to avoid contacting each lead of the IC chip insertable into the IC chip socket.

Another example relates to an IC chip socket that can include a housing formed of non-conductive material, the housing having an inner wall that defines a boundary for the IC chip socket. The IC chip socket can also include active pogo pins positioned within the housing, each active pogo pin is moveable in a direction substantially perpendicular to an insertion direction of a IC chip insertable into the IC chip socket. Each active pogo pin can positioned to contact a target pogo pin contact of the IC chip insertable into the IC chip socket.

Still yet another example relates to a method that can include identifying target pogo pin contacts for a design of an IC chip. The method can also include positioning moveable pogo pins within a flexible IC chip socket into an active position. Each active position of the moveable pogo pins corresponds to one of the target pogo pin contacts. The method can further include positioning an IC chip fabricated based on the design of the IC chip into the flexible IC chip socket to contact the moveable pogo pins at leads of the IC chip.

DETAILED DESCRIPTION

A flexible integrated circuit (IC) chip socket includes moveable pogo pins. Some (or all) of the pogo pins can be moved to a position to contact a lead of an IC chip inserted into the flexible IC chip socket. Moreover, the remaining moveable pogo pins can be moved to a position that avoids contact with the IC chip. Each of the moveable pogo pins can carry an electrical signal between the IC chip and an external component (e.g., a test controller) via a longitudinal spring portion.

By implementing the flexible IC chip socket described herein, a relatively large range of footprint sizes of IC chips can be accommodated. Moreover, the design of the flexible IC chip socket ensures that the IC chip does not get "stuck up" (e.g., jammed) during a removal of the IC chip of the flexible IC chip socket.

Figure 1:
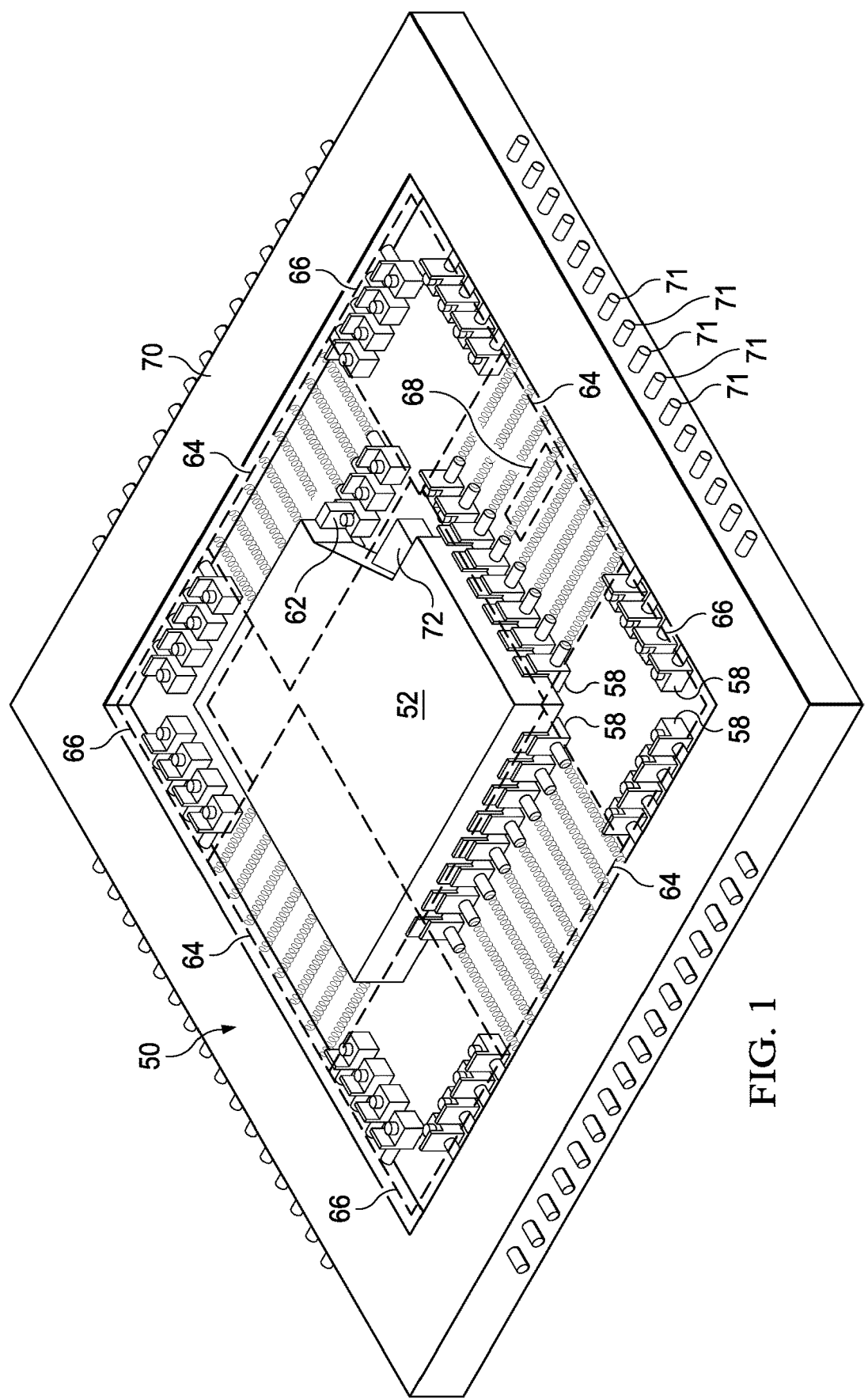
FIG. 1 illustrates an example of a flexible integrated circuit (IC) chip socket.

FIG. 1 illustrates an example of a flexible integrated circuit (IC) chip socket 50 that can be employed in testing of an IC chip 52 insertable into the IC chip socket 50, such as an IC chip implemented on a no-lead package. The IC chip 52 can be a quad-flat no-leads (QFN) IC chip, a dual-flat no-leads (DFN) IC chip, etc. The flexible IC chip socket 50 includes moveable pogo pins 58. For purposes of simplification of explanation, not all of the moveable pogo pins 58 are labeled. Each of the moveable pogo pins 58 can be moved from an inactive position to an active position. Each moveable pogo pin 58 in the active position can be situated to make a conductive contact with a lead 62 of the IC chip 52. Each moveable pogo pin 58 in the inactive position avoids contact with a lead and/or other conductive region of the IC chip 52. In some examples, each moveable pin 58 in the inactive position can be positioned to avoid contact with any portion of the IC chip 52. In FIG. 1, a portion of the IC chip 52 is cut away from view to reveal interaction between the IC chip 52 and the moveable pogo pins 58.

A set of active pogo pins 64 demonstrates a set of the moveable pogo pins 58 moved to the active position. The set of active pogo pins 64 defines a boundary of the flexible IC chip socket 50. That is, a perimeter of the IC chip 52 fits within a boundary defined by the set of active pogo pins 64. A set of inactive pogo pins 66 demonstrates a set of the moveable pogo pins 58 moved to the inactive position. Each of the moveable pogo pins 58 can be moved from the inactive position to the active position or vice versa by expanding (or contracting) a longitudinal spring portion 68 (e.g., corkscrew shaped portion) of a conductive wire. In FIG. 1, only one longitudinal spring portion 68 is labeled, but it is to be understood that each of the moveable pogo pins 58 includes a longitudinal spring portion 68.

The moveable pogo pins 58 can be moved along a plane that is perpendicular to an insertion direction (e.g., a downward direction) of the IC chip 52. That is, the moveable pogo pins 58 can move in substantially lateral direction that corresponds to the lateral spring portion 68 of each moveable pogo pin 58.

The longitudinal spring portion 68 extends through a bore (hole) in a (non-conductive) housing 70. The housing 70 includes a recessed portion that provides a boundary for movement of the moveable pogo pins 58. External leads 71 extend out of the housing and can be electrically coupled to test equipment (e.g., a test controller). For purpose of simplification of explanation, only some of the external leads 71 are labeled in FIG. 1.

Figure 2:
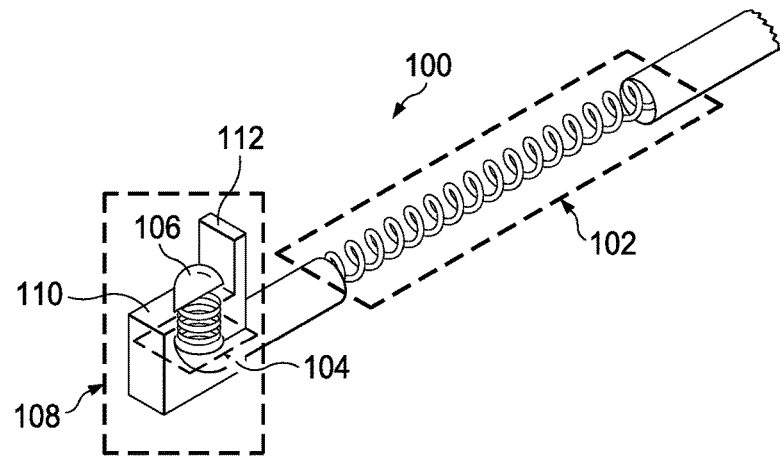
FIG. 2 illustrates an example of an active pogo pin.

FIG. 2 illustrates an example of a moveable pogo pin 100 in the active position, which can be referred to as an active pogo pin 100. The active pogo pin 100 can be employed to implement one of the moveable pogo pins 58 in the set of active pogo pins 64 of FIG. 1. The active pogo pin 100 has a longitudinal spring portion 102 and a vertical spring portion 104. The longitudinal spring portion 102 can provide horizontal force (e.g., force in a lateral direction) and the vertical spring portion 104 can provide force in a vertical direction (e.g., upwards force) on a pin portion 106. The pin portion 106 can have a cylindrical body with a semispherical end, which end can be referred to as a semispherical head.

The pin portion 106 is circumscribed by a lead stopper 108. The lead stopper 108 can include a base portion 110 and a vertical extension 112. The active pogo pin 100 is configured to receive a lead of an IC chip. In particular, the pin portion 106 can contact the lead and compress the vertical spring portion 104.

Electrical current (e.g., electrical stimuli) can be injected into the active pogo pin 100. In some situations, the electrical current can be provided from a controller of a test unit (e.g., as an input signal) and conducted along a body (which includes the pin portion 106 and the longitudinal spring portion 102) of the active pogo pin 100 and output at the pin portion 106. In other situations, the electrical current can be received at the pin portion 106 (e.g., as an output current, such as a response signal) and transmitted along the body of the active pogo pin 100.

Figure 3:
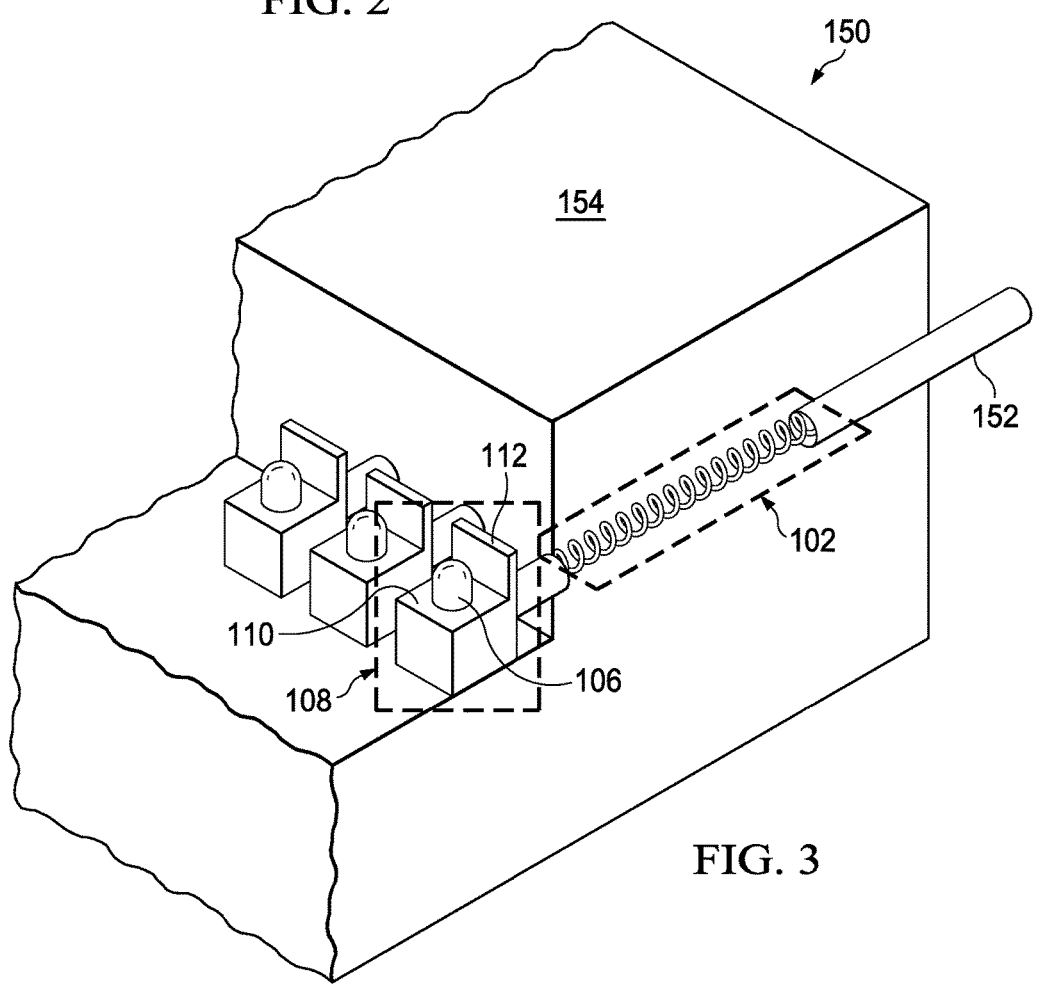
FIG. 3 illustrates an example of an inactive pogo pin.

FIG. 3 illustrates an example of a moveable pogo pin 150 in the inactive position, which can be referred to as an inactive pogo pin 150. FIGS. 2 and 3 employ the same reference numbers to denote the same structure. In the inactive position, the vertical spring portion (hidden from view) is extended (e.g., not-compressed), such that the pin portion 106 extends to a maximum height. In the inactive position, the longitudinal spring portion 102 is compressed. Thus, as illustrated in FIGS. 2 and 3, the active pogo pin 100 and the inactive pogo pin 150 can be moved from the active position to the inactive position (and vice versa) by expansion and contraction of the longitudinal spring portion 102.

A section of the longitudinal spring portion 102 engages with a spring actuator 152 (e.g., a threaded, nut-like assembly) of a housing 154. The spring actuator 152 can apply rotational force on the inactive pogo pin 150 that move the inactive pogo pin 150 to a desired position (e.g., the active position) and hold the inactive pogo pin 150 in place upon reaching the desired position. In this manner, the inactive pogo pin 150 can be move between the active position and the inactive position, and vice versa.

Referring back to FIG. 1, the IC chip 52 can be positioned on the moveable pogo pins 58 that are in the active condition. The IC chip 52 can be held in place by application of a downward force applied by a tool or directly by a test operator (e.g., test equipment and/or user interaction). As demonstrated in FIGS. 2 and 3, each of the moveable pogo pins 58 can be moved longitudinally. This movement can be commensurate with a footprint size of the IC chip 52. That is, a subset of the moveable pogo pins 58 (the set of active pogo pins 64) can be moved such that each lead on the IC chip 52 contacts a corresponding moveable pogo pin 58 in the active position.

More particularly, the moveable pogo pins 58 in the active position can be moved to a position to accommodate a largest footprint allowed for the IC chip 52 within acceptable tolerances for the particular IC chip 52 being tested. As used herein, the term "footprint" of the IC chip 52 refers to a perimeter of the IC chip 52. If an IC chip 52 cannot be properly inserted within the boundary set by the moveable pogo pins 58 in the active position, it may be presumed that the IC chip 52 has a footprint that falls outside acceptable limits (which may indicate a faulty IC chip 52).

Figure 4:
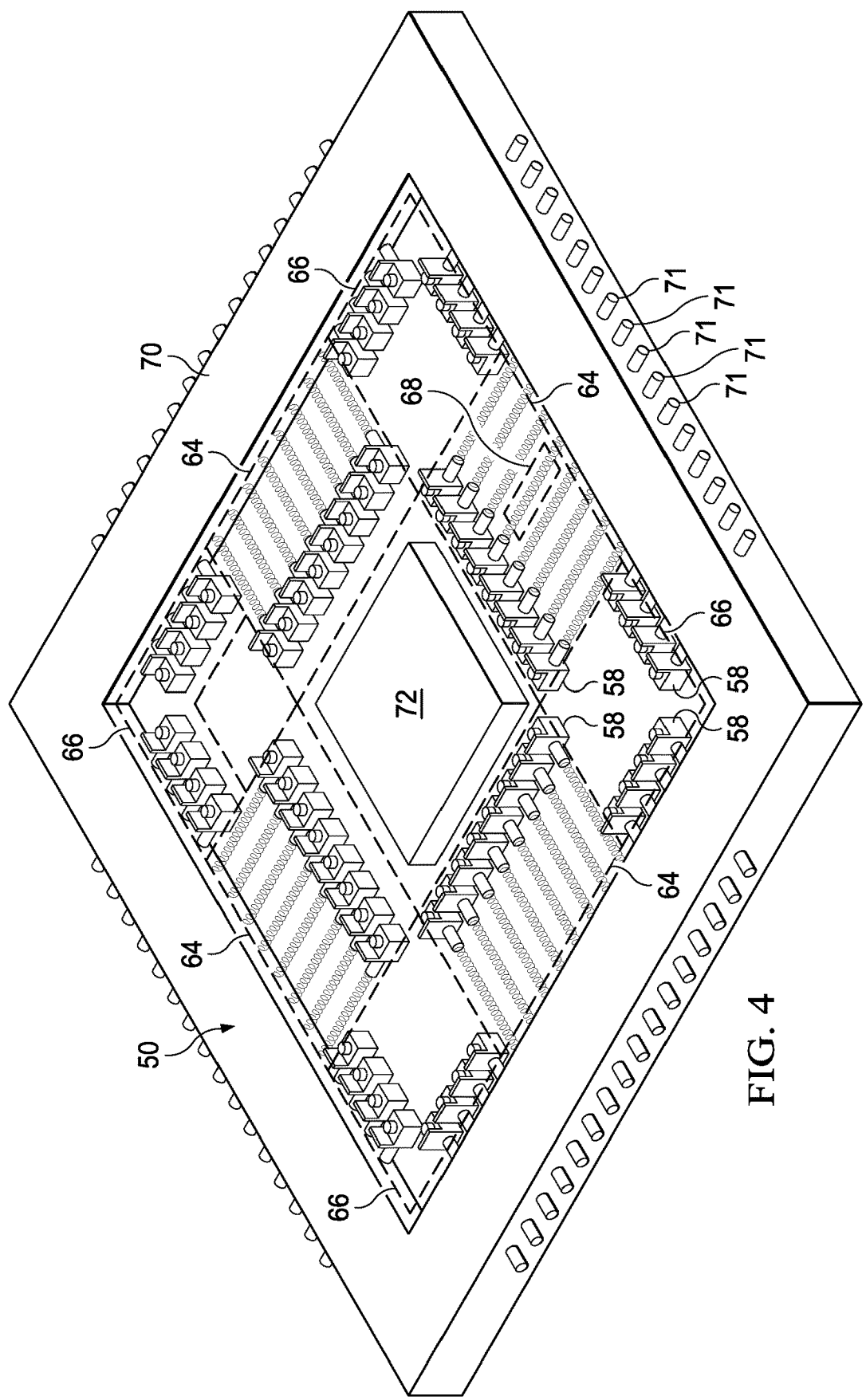
FIG. 4 illustrates an example of the flexible IC chip socket of FIG. 1 without an IC chip.

The flexible IC chip socket 50 can include a platform 72 that can provide a limit of movement for the IC chip 52. FIG. 4 illustrates an example of the flexible IC chip socket 50 wherein the IC chip 52 has been removed. The height of the platform 72 can be set to prevent the application of an excessive amount of downward force on the set of active pogo pins 64. Additionally, the platform 72 can operate as a heat sink to dissipate heat generated by the IC chip 52 during the testing process.

Referring back to FIG. 1, additionally, as explained in detail herein, the moveable pogo pins 58 have a relatively small contact region (e.g., the head of the pin portion 106 illustrated in FIGS. 2 and 3) with the leads 62. The set of active pogo pins 64 can be positioned such that the pin portion of a given moveable pogo pin 58 is set to contact a given (corresponding) lead 62 at a nominal position, which can be referred to as a target pogo pin contact. Thus, if the given lead 62 is located within a region of acceptable tolerances, the given lead 62 will contact the given moveable pogo pin 58. If the given lead 62 fails to contact the given moveable pogo pin 58, it may be inferred that the IC chip 52 falls outside acceptable tolerances (which may indicate that the IC chip 52 is faulty).

It is noted that although the moveable pogo pins 58 are illustrated and described as being arranged on four sides of the inserted IC chip 52, it is to be understood that in some examples, the moveable pogo pins 58 could alternatively be arranged on one (1), two (2) or three (3) sides of the inserted IC chip 52. Moreover, the IC chip 52 is illustrated as being rectangular, but in other examples, the IC chip 52 could have more or less than four sides, and in some examples, the IC chip 52 could have a curved side. In any of these situations, the moveable pogo pins 58 of the flexible IC chip socket. 52 can be positioned to accommodate such variations in the shape of the IC chip.

Upon positioning the IC chip 52 on the moveable pogo pins 58 in the active position, a testing procedure can be executed. During the testing procedure, signals (e.g., electrical stimuli and response signals) can be transmitted to and from the leads of the IC chip 52 via the contacted moveable pogo pins 58. By implementing the flexible IC chip socket 50, a large range of footprint sizes of IC chips can be tested. In contrast, conventional IC chip sockets are formed for a single sized IC chip. Thus, in conventional IC chip socket design, IC chips are often designed around (and limited by) the size of the IC chip socket. In contrast, by adjusting the positions of the moveable pogo pins 58, the flexible IC chip socket 50 allows for a wide range of sizes of IC chips to be inserted, thereby allowing a wider range of IC chips to be designed for the flexible IC chip socket 52.

Moreover, the IC chip 52 can be easily removed from the flexible IC chip socket 50, so as to avoid a situation where the IC chip 52 is "stuck up" (e.g., wedged or jammed) thereby preventing removal. In particular, the moveable pogo pins 58 continue to exert force in an upward direction even after insertion of the IC chip 52 into the flexible IC chip socket 50, such that a tester holds the IC chip 52 in place during testing. In contrast, in conventional IC chip sockets, the IC chip is seated in place, and no additional downward force is applied. However, removing the IC chips from conventional IC chip sockets can be difficult and/or slow, particularly if the IC chip gets "stuck up" during the removal process.

Figure 5:
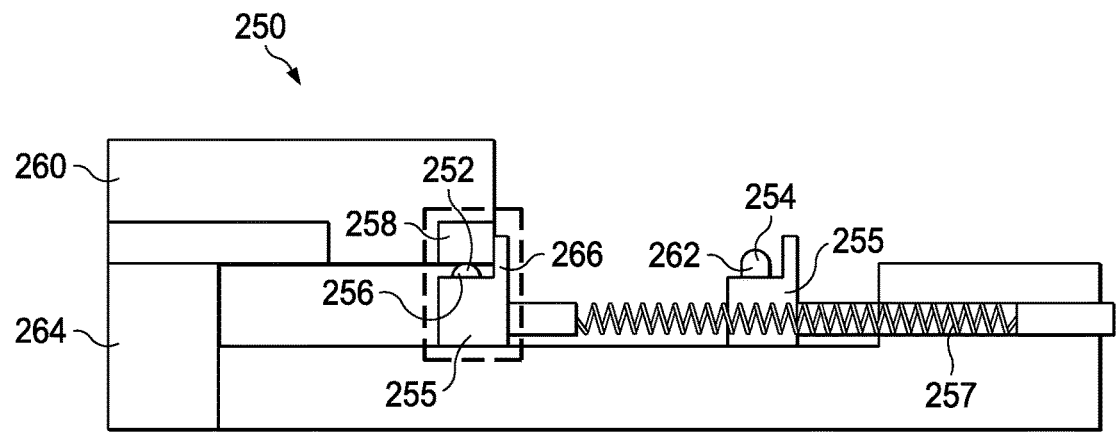
FIG. 5 illustrates a side view of a flexible IC chip socket.

FIG. 5 illustrates a side view of a flexible IC chip socket 250. The flexible IC chip socket 250 includes an active pogo pin 252 and an inactive pogo pin 254. The active pogo pin 252 can be employed to implement a moveable pogo pin 58 of FIG. 1 in the active position and the inactive pogo pin 254 can be employed to implement a moveable pogo pin 58 of FIG. 1 in the inactive position. The active pogo pin 252 and the inactive pogo pin 254 can each have a lead stopper 255 and a spring actuator 257 that can change the position of the active pogo pin 252 and/or the inactive pogo pin 254.

A pin portion 256 of the active pogo pin 252 can be in conductive contact with a lead 258 of an IC chip 260. The pin portion 262 of the inactive pogo pin 254 is not in contact with any portion of the IC chip 260. Moreover, as illustrated, the pin portion 256 of the active pogo pin 252 is compressed relative to the pin portion 262 of the inactive pogo pin 254. Moreover, a platform 264 of the flexible IC chip socket 250 prevents downward movement of the IC chip 260 beyond a level (height) set by the platform 264.

Furthermore, a vertical extension 266 of the active pogo pin 252 prevents movement of the IC chip 260 in the longitudinal direction. Accordingly, upon application of a downward pressure of the IC chip 260 during a test procedure (e.g., by a test operator), the IC chip 260 remains in a relatively stationary position.

Figure 6:
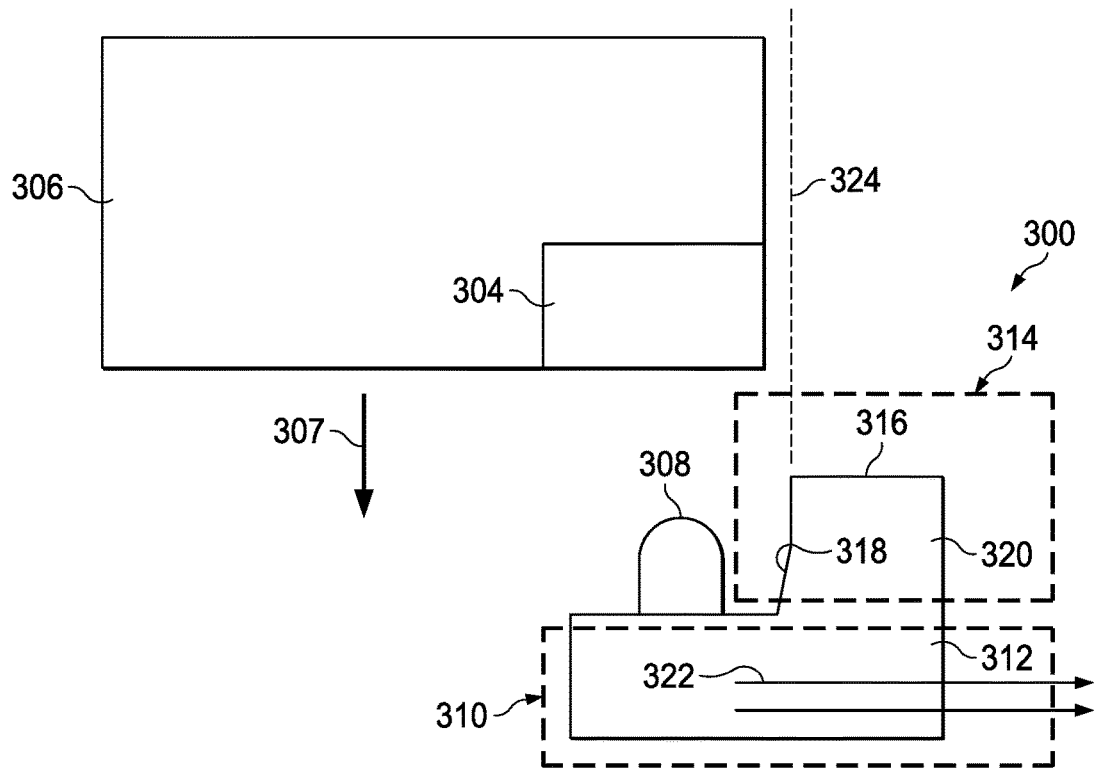
FIG. 6 illustrates an example diagram depicting an active pogo pin positioned to contact a lead of an IC chip.

FIG. 6 illustrates an example diagram depicting an active pogo pin 300 positioned to contact a lead 304 of an IC chip 306. The IC chip 306 can be a flat no leads IC chip (e.g., a QFN or DFN IC chip). Force can be applied on the IC chip 306 causing the IC chip 306 to move in a downward direction indicated by the arrow 307.

The active pogo pin 300 can include a pin portion 308 that extends from a base portion 310 of a lead stopper 312. The lead stopper 312 can be formed from a non-conductive material, such as plastic. The lead stopper 312 can also include a vertical extension 314 that extends in a direction normal to the base portion 310 of the lead stopper 312.

The vertical extension 314 can have a top surface 316, an inner surface 318 that faces the pin portion 308 (and a platform, not shown) and an outer surface 320 that faces away from the pin portion 308. The inner surface 318 can be shaped to have a sloped region that provides an inclined plane for the IC chip 306. The sloped region can have surface with an angle of less than 90 degrees from the angle of the base portion 310. A size of the sloped region of the inner surface 318 corresponds to an allowed tolerance of the footprint size of the IC chip 306. The allowed tolerance of the footprint size of the IC chip 306 can correspond to a maximum size permitted for the IC chip 306. That is, the allowed tolerance allows for variations in the packaging process that result in difference sizes for the same IC chip design. Moreover, the greater the allowed tolerance of the footprint size of the IC chip 306, the greater area occupied by the sloped region of the inner surface 318.

Upon moving the IC chip 306 in the downward direction 307, the lead 304 of the IC chip 306 contacts the pin portion 308 and compresses the pin portion 308 in a manner described herein. Moreover, upon the lead 304 contacting the sloped portion of the inner surface 318, the active pogo pin 300 moves by a relatively small distance in a direction indicated by the arrow 322. In this manner, as long as the IC chip 306 has a footprint (e.g., a perimeter size) within the acceptable tolerances (corresponding to the size of the sloped region of the inner surface 318), the pin portion 308 of the active pogo pin 300 can make conductive contact with the lead 304.

However, if the footprint size of the IC chip 306 exceeds the acceptable tolerance, a portion of the IC chip 306 may extend beyond a boundary 324 defined by the inner surface 318. In such a situation, upon moving the IC chip 306 in the downward direction 307, the lead 304 of the IC chip 306 would contact the top surface 316 of the vertical extension 314. In such a situation, the lead 304 would not contact the pin portion 308 of the active pogo pin 300, and it could be quickly determined that the footprint size of the IC chip 306 exceeds the acceptable tolerance. In many test procedures, such a determination could lead to the IC chip 260 being rejected.

Figure 7:
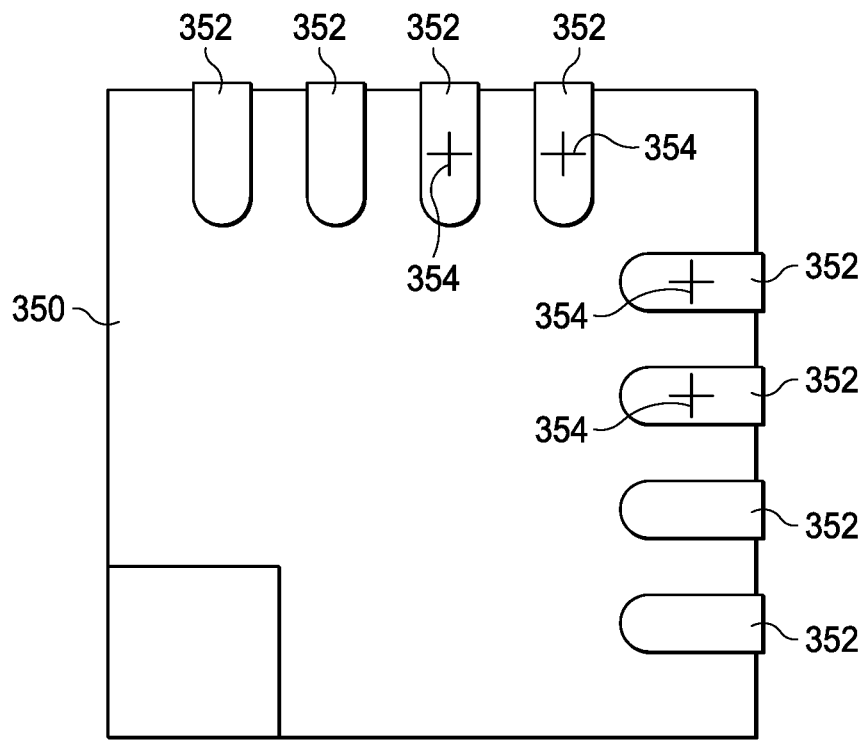
FIG. 7 illustrates an example of a design of an IC chip.
Figure 8:
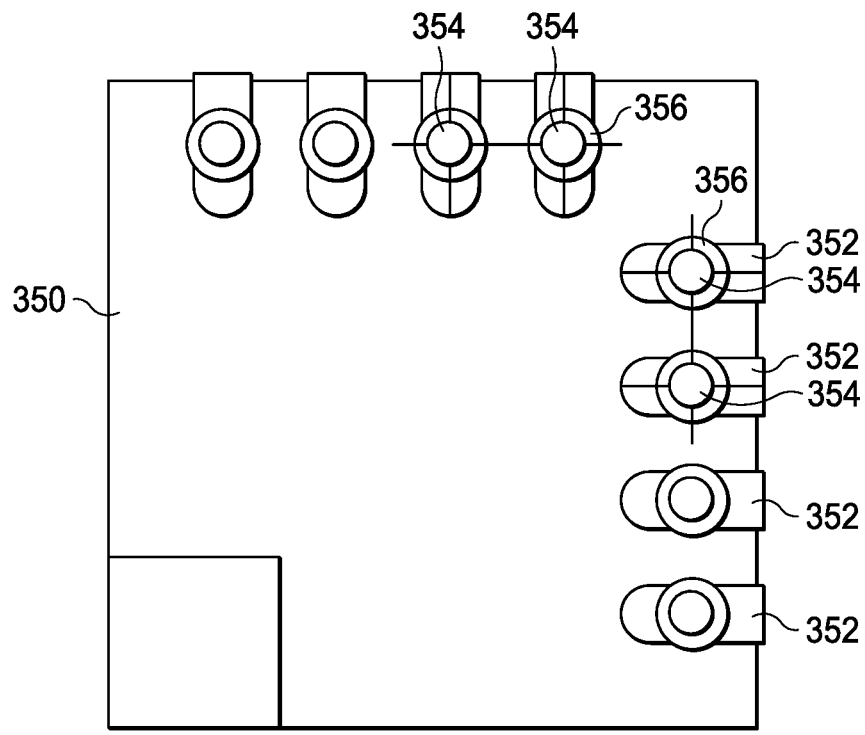
FIG. 8 illustrates an example of the IC chip of FIG. 7 in contact with pogo pins.

FIG. 7 illustrates an example of a portion of a diagram (design) of an IC chip 350 that could be employed to set a location of moveable pogo pins for a flexible IC chip socket, such as the flexible IC chip socket of FIG. 1. The diagram of the IC chip 350 can represent a flat no-leads IC chip, such as QFN or a DFN IC chip. The diagram of the IC chip 350 depicts (flat) leads 352 arranged at a periphery of the IC chip 350. The dimensions of the diagram of the IC chip 350 can be measured to determine a target pogo pin contact 354 on each of the leads 352. The target pogo pin contact 354 can be set, to a nominal position on each lead 352 (or some subset thereof), which nominal position can be located at half the width of the lead 352 and half the length of a given lead 352. FIG. 8 illustrates the portion of the IC chip 350 illustrated in FIG. 6, wherein active pogo pins 356 contact the leads 352 at corresponding target pogo pin contacts 354.

Upon fabrication of an IC chip based on the diagram of the IC chip 350 the position and size of the actual (fabricated) leads 352 can vary by an amount defined by predetermined tolerances. However, by employing the active pogo pins 356 the chance of a miscontact (misalignment) between the active pogo pins 356 and the leads 352 when the leads 352 are located within acceptable tolerances is reduced since the target pogo pin contacts 354 of the leads 352 is selected at the nominal position of the leads 352 and the surface contact area of the active pogo pins 356 is relatively small. Thus, in instances where there is a miscontact between any of the active pogo pins 356 and the leads 352, it is likely that the fabricated IC chip would be rejected for exceeding acceptable tolerances.

Figure 9:
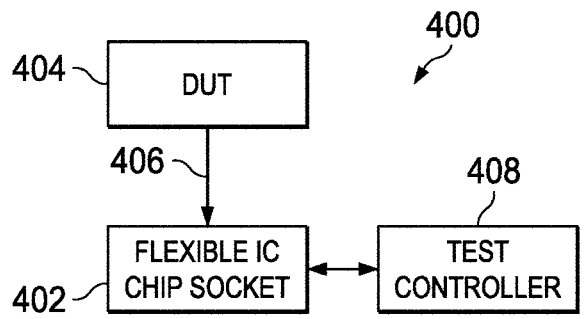
FIG. 9 illustrates an example of a system for testing IC chips.

FIG. 9 illustrates an example of a system 400 for testing IC chips. The system 400 can include a flexible IC chip socket 402, such as the flexible IC chip socket 50 of FIG. 1 and/or the flexible IC chip socket 250 of FIG. 5. The flexible IC chip socket 402 can be configured to receive IC chips of a particular IC chip design. Such configuring can include positioning (e.g., by a test operator) moveable pogo pins within the flexible IC chip socket 402 to contact each of target pogo pin contacts (e.g., the target pogo pin contacts 354 of FIGS. 7 and 8) for the particular IC chip design.

Upon configuring the flexible IC chip socket 402, a device under test (DUT) 404 can be inserted into the flexible IC chip socket 402 by moving the DUT 404 in a direction indicated by the arrow 406. The DUT 404 can be an instance of an IC chip fabricated based on the particular IC chip design.

A test controller 408 can be communicatively (electrically) coupled to external leads on the flexible IC chip socket 402 (e.g., the external leads 71 of FIGS. 1 and 4). The test controller 408 can be representative of test equipment, such as a computing device with machine readable instructions (e.g., application software) for configuring the flexible IC chip socket 402 and/or executing a test of an instance of an IC chip (e.g., the DUT 404) with the particular IC chip design. Alternatively, the test controller 408 could be representative of a microcontroller with embedded instructions or nearly any electrical equipment that can apply electrical stimuli to the DUT 404 via some (or all) of the external leads and measure electrical responses generated by the DUT 404 via some (or all) of the external leads on the flexible IC chip socket 402. Upon insertion of the DUT 404 into the flexible IC chip socket 402, the test controller 408 can apply the electrical stimuli to the DUT 404 and measure the electrical responses from the DUT 404 via a set of the external leads of the flexible IC chip socket 402. Based on the responses to the electrical stimuli, the test controller 408 can determine if the DUT 404 operates within acceptable tolerances to approve or reject the DUT 404. Moreover, this process can be repeated for other instances of the DUT 404.

Figure 10:
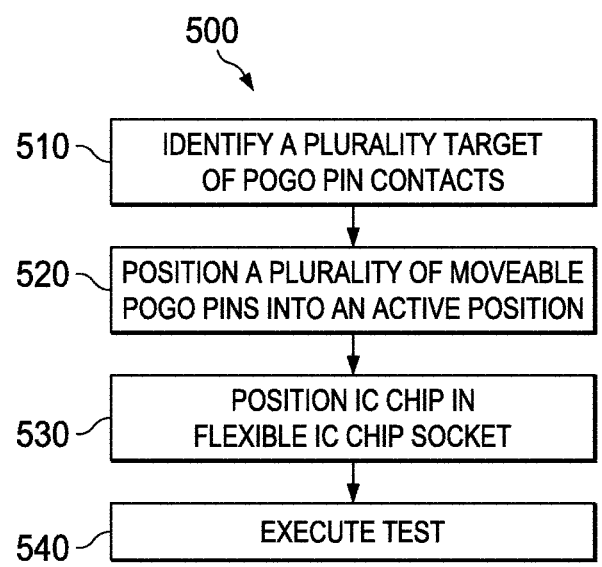
FIG. 10 illustrates a flowchart of an example method of testing an IC chip.

In view of the foregoing structural and functional features described above, example methods will be better appreciated with reference to FIG. 10. While, for purposes of simplicity of explanation, the example method of FIG. 10 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 10 illustrates a flowchart of an example method 500 for testing an IC chip. The method 500 can be implemented by interaction with a flexible IC chip socket, such as the flexible IC chip socket 50 of FIG. 1. At 510, target pogo pin contacts can be identified (e.g., by a test operator) for a given IC chip design. The given IC chip design can be a package design for a flat no-leads IC chip, such as a QFN or a DFN IC chip. The target pogo pin contacts can be positioned at one-half a length and one half a height of each lead in the given IC chip design.

At 520, moveable pogo pins can be moved laterally (e.g., by the test operator) to an active position. The active position of each moveable pogo pin can correspond to a target pogo pin contact of the given IC chip design. At 530, a fabricated IC chip based on the given IC chip design can be positioned (e.g., by the test operator) in the flexible IC chip socket. Upon positioning the fabricated IC chip in the flexible IC chip socket, the pogo pins moved to the active position can contact leads of the fabricated IC chip. At 540, a test of the fabricated IC chip can be executed (e.g., by the test operator). Execution of the test can include the application of electrical stimuli (e.g., by a test controller) to the fabricated IC chip and a measure (e.g., by the test controller) of response signals by the fabricated IC chip.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. An integrated circuit (IC) chip socket comprising:
a non-conductive housing; and
pogo pins positioned within the non-conductive housing, each pogo pin moveable in a direction substantially perpendicular to an insertion direction of an IC chip into the IC chip socket, selected ones of the pogo pins positioned to contact respective leads of an IC chip when inserted into the IC chip socket, nonselected ones of the pogo pins positioned to avoid contacting any leads of the IC chip when inserted into the IC chip socket.

2. The IC chip socket of claim 1, each of the pogo pins including a longitudinal spring portion formed with conductive material that extends through a corresponding bore in the non-conductive housing.

3. An integrated circuit (IC) chin socket comprising:
a non-conductive housing; and
moveable pogo pins positioned within the non-conductive housing, the moveable pogo pins including:
   active pogo pins, each active pogo pin being positioned to contact a corresponding lead of an IC chip insertable into the IC chip socket; and
   inactive pogo pins, each inactive pogo pin being positioned to avoid contacting any leads of the IC chin insertable into the IC chin socket, each active and inactive moveable pogo pin including:
      a longitudinal spring portion formed with conductive material that extends through a corresponding bore in the non-conductive housing;
      a lead stopper formed of a non-conductive material; and
      a pin portion extending through the lead stopper.

4. The IC chip socket of claim 3, the pin portion extending in a direction normal to the longitudinal spring portion.

5. The IC chip socket of claim 4, the pin portion including a semispherical head.

6. The IC chip socket of claim 3, the lead stopper including a base portion and a vertical extension.

7. The IC chip socket of claim 6, the vertical extension including:
a substantially flat top surface;
an outer surface that faces away from a platform of the IC chip socket that is circumscribed by the moveable pogo pins of the flexible IC chip socket; and
an inner surface that faces the platform of the IC chip socket.

8. The IC chip socket of claim 7, the inner surface of the vertical extension including a sloped region.

9. The IC chip socket of claim 8, the slope region being configured to redirect a downward force on a given IC chip being inserted into the IC chip socket that contacts the sloped region of the vertical extension causing the moveable pogo pin to move in a lateral direction.

10. The IC chip socket of claim 1, the IC chip being a flat no-leads IC chip.

11. The IC chip socket of claim 10, the IC chip being a quad flat no-leads IC chip.

12. The IC chip socket of claim 10, each of the selected pogo pins being positioned to contact a target pogo pin contact of the IC chip.

13. The IC chip of claim 12, the target pogo pin contact on each lead of the IC chip being positioned at one-half an expected length and one-half an expected width of each respective lead.

14. The IC chip socket of claim 1, each of the selected pogo pins being configured to conduct electrical signals between the IC chip and a test controller.

15. An integrated circuit (IC) chip socket comprising:
a housing formed of non-conductive material, the housing having an inner wall that defines a boundary for the IC chip socket; and
active pogo pins positioned within the housing, each active pogo pin is moveable in a direction substantially perpendicular to an insertion direction of an IC chip into the IC chip socket, and each active pogo pin is positioned to contact a target pogo pin contact of the IC chip when the IC chip is inserted into the IC chip socket.

16. The flexible IC chip socket of claim 15, further comprising:
inactive pogo pins positioned within the housing, each inactive pogo pin is moveable in the direction substantially perpendicular to the insertion direction of the IC chip insertable into the IC chip socket, and each of the inactive pogo pins is positioned to avoid contact with the IC chip when the IC chip is inserted into the IC chip socket.

17. The flexible IC chip socket of claim 16, the active pogo pins defining a boundary for a perimeter of the IC chip when the IC chip is inserted into the IC chip socket.

18. An integrated circuit (IC) chin socket comprising:
a housing formed of non-conductive material, the housing having an inner wall that defines a boundary for the IC chip socket;
active pogo pins positioned within the housing, each active pogo pin is moveable in a direction substantially perpendicular to an insertion direction of an IC chip insertable into the IC chip socket, and each active pogo pin is positioned to contact a target pogo pin contact of the IC chip insertable into the IC chin socket, the active pogo pins defining a boundary for a perimeter of the IC chip insertable into the IC chip socket;
inactive pogo pins positioned within the housing, each inactive pogo pin is moveable in the direction substantially perpendicular to the insertion direction of the IC chip insertable into the IC chip socket, and each of the inactive pogo pins is positioned to avoid contact with each a lead of the IC chip insertable into the IC chip socket; and
wherein each of the active pogo pins and each of the inactive pogo pins including a lead stopper formed of a non-conductive material.

19. A method comprising:
identifying target pogo pin contacts for an integrated circuit (IC) chip;
positioning moveable pogo pins within an IC chip socket, each pogo pin is moveable in a direction substantially perpendicular to an insertion direction of an IC chip into the IC chip socket, each position of the moveable pogo pins corresponding to one of the target pogo pin contacts; and
positioning an IC chip having the target pogo pin contacts into the IC chip socket to contact the moveable pogo pins at leads of the IC chip.

20. The method of claim 19, further comprising:
testing the IC chip, the testing including:
   applying electrical stimuli to the leads of the fabricated IC chip via the moveable pogo pins; and
   measuring response signals transmitted from the fabricated IC chip through the pogo pins.

21. A method for testing an integrated circuit (IC) chip, comprising:
selecting an integrated circuit (IC) chip to be tested;
positioning moveable pogo pins within an IC chip socket, each pogo pin is moveable in a direction substantially perpendicular to an insertion direction of an IC chip into the IC chip socket, each position of the moveable pogo pins corresponding to a target lead or contact on the selected integrated circuit (IC) chip to be tested; and
positioning the selected integrated circuit (IC) chip into the IC chip socket to contact the moveable pogo pins to the leads or contacts on the integrated circuit (IC) chip.

22. The method of claim 21, further comprising:
testing the IC chip, the testing including:
- applying electrical stimuli to the leads or contacts of the integrate circuit (IC) chip via the moveable pogo pins; and
- measuring response signals transmitted from the integrate circuit (IC) chip through the pogo pins.

* * * * *